United States Patent
Fujii et al.

(10) Patent No.: US 12,002,777 B2
(45) Date of Patent: Jun. 4, 2024

(54) SEMICONDUCTOR DEVICE WITH BONDED SUBSTRATES

(71) Applicant: KIOXIA CORPORATION, Tokyo (JP)

(72) Inventors: Kotaro Fujii, Yokkaichi Mie (JP); Shinya Watanabe, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 203 days.

(21) Appl. No.: 17/461,550

(22) Filed: Aug. 30, 2021

(65) Prior Publication Data

US 2022/0302055 A1    Sep. 22, 2022

(30) Foreign Application Priority Data

Mar. 16, 2021   (JP) ................. 2021-042893

(51) Int. Cl.
| | | |
|---|---|---|
| H01L 23/00 | (2006.01) | |
| H01L 25/00 | (2006.01) | |
| H01L 25/065 | (2023.01) | |
| H01L 25/18 | (2023.01) | |

(52) U.S. Cl.
CPC .............. *H01L 24/08* (2013.01); *H01L 24/05* (2013.01); *H01L 24/80* (2013.01); *H01L 25/0657* (2013.01); *H01L 25/18* (2013.01); *H01L 25/50* (2013.01); *H01L 2224/05082* (2013.01); *H01L 2224/05147* (2013.01); *H01L 2224/05149* (2013.01); *H01L 2224/05157* (2013.01); *H01L 2224/05166* (2013.01); *H01L 2224/05181* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ......... H01L 24/08; H01L 24/05; H01L 24/80; H01L 2224/80895; H01L 25/0657; H01L 25/18; H01L 2224/08145
See application file for complete search history.

(56) References Cited

U.S. PATENT DOCUMENTS

| | | | |
|---|---|---|---|
| 2018/0040575 A1 | 2/2018 | Lin | |
| 2019/0244856 A1 | 8/2019 | Hatano | |
| 2019/0296073 A1* | 9/2019 | Kotoo | ........... H01L 24/89 |
| 2020/0075459 A1* | 3/2020 | Zeng | ........... H01L 23/3171 |

(Continued)

FOREIGN PATENT DOCUMENTS

| | | |
|---|---|---|
| CN | 112292757 A | 1/2021 |
| JP | 2019140178 A | 8/2019 |

(Continued)

*Primary Examiner* — Mamadou L Diallo
(74) *Attorney, Agent, or Firm* — Kim & Stewart LLP

(57) ABSTRACT

According to one or more embodiments, a semiconductor device includes a first substrate and a second substrate. The first substrate includes a first metal layer and a first insulating layer. The first insulating layer surrounds the first metal layer. The second substrate includes a second metal layer, a second insulating layer, and a first conducive body. The second metal layer is in contact with the first metal layer. The second insulating layer surrounds the second metal layer and is in contact with the first insulating layer. A part of the first conductive body is in the second metal layer and extends in a first direction toward the first metal layer.

20 Claims, 15 Drawing Sheets

(56) References Cited

U.S. PATENT DOCUMENTS

| | | | |
|---|---|---|---|
| 2020/0294958 A1 | 9/2020 | Shibata | |
| 2021/0091001 A1 | 3/2021 | Suzuki et al. | |
| 2022/0085048 A1* | 3/2022 | Lee | H01L 21/823462 |
| 2022/0115344 A1* | 4/2022 | Kim | H01L 24/80 |
| 2022/0139855 A1* | 5/2022 | Hwang | H01L 24/80 |
| | | | 257/314 |
| 2022/0157839 A1* | 5/2022 | Lee | H10B 43/27 |
| 2022/0216226 A1* | 7/2022 | Choi | G11C 5/06 |
| 2022/0270992 A1* | 8/2022 | Wada | H01L 24/80 |
| 2022/0336394 A1* | 10/2022 | Ishikawa | H01L 24/06 |
| 2022/0359456 A1* | 11/2022 | Chen | H01L 25/0657 |
| 2022/0367503 A1* | 11/2022 | Sun | H01L 24/08 |
| 2022/0367504 A1* | 11/2022 | Sun | H10B 41/41 |
| 2023/0005944 A1* | 1/2023 | Zhang | H01L 24/08 |

FOREIGN PATENT DOCUMENTS

| | | |
|---|---|---|
| TW | 201806106 A | 2/2018 |
| TW | 202036826 A | 10/2020 |

* cited by examiner

SEMICONDUCTOR DEVICE WITH BONDED SUBSTRATES

CROSS-REFERENCE TO RELATED APPLICATION(S)

This application is based upon and claims the benefit of priority from Japanese Patent Application No. 2021-042893, filed Mar. 16, 2021, the entire contents of which are incorporated herein by reference.

FIELD

Embodiments described herein relate generally to a semiconductor device.

BACKGROUND

A wafer bonding technique in which two different wafers are bonded to each other can provide semiconductor devices with improved functionality and/or better device integration. The two wafers each include dies with an electronic circuit or portions thereof. An improved functionality or higher integration of a semiconductor memory device can be achieved by, for example, bonding a semiconductor wafer having a memory cell array formed thereon with another semiconductor wafer having formed thereon a control circuit that can be used to control the memory cell array. The bonded wafers are joined to one another with a heat treatment process, then bonded wafers are divided (diced) into a plurality semiconductor chips.

In general, improvement in reliability for the semiconductor devices manufactured using such a wafer bonding technique is desirable.

DETAILED DESCRIPTION

Figure 1:
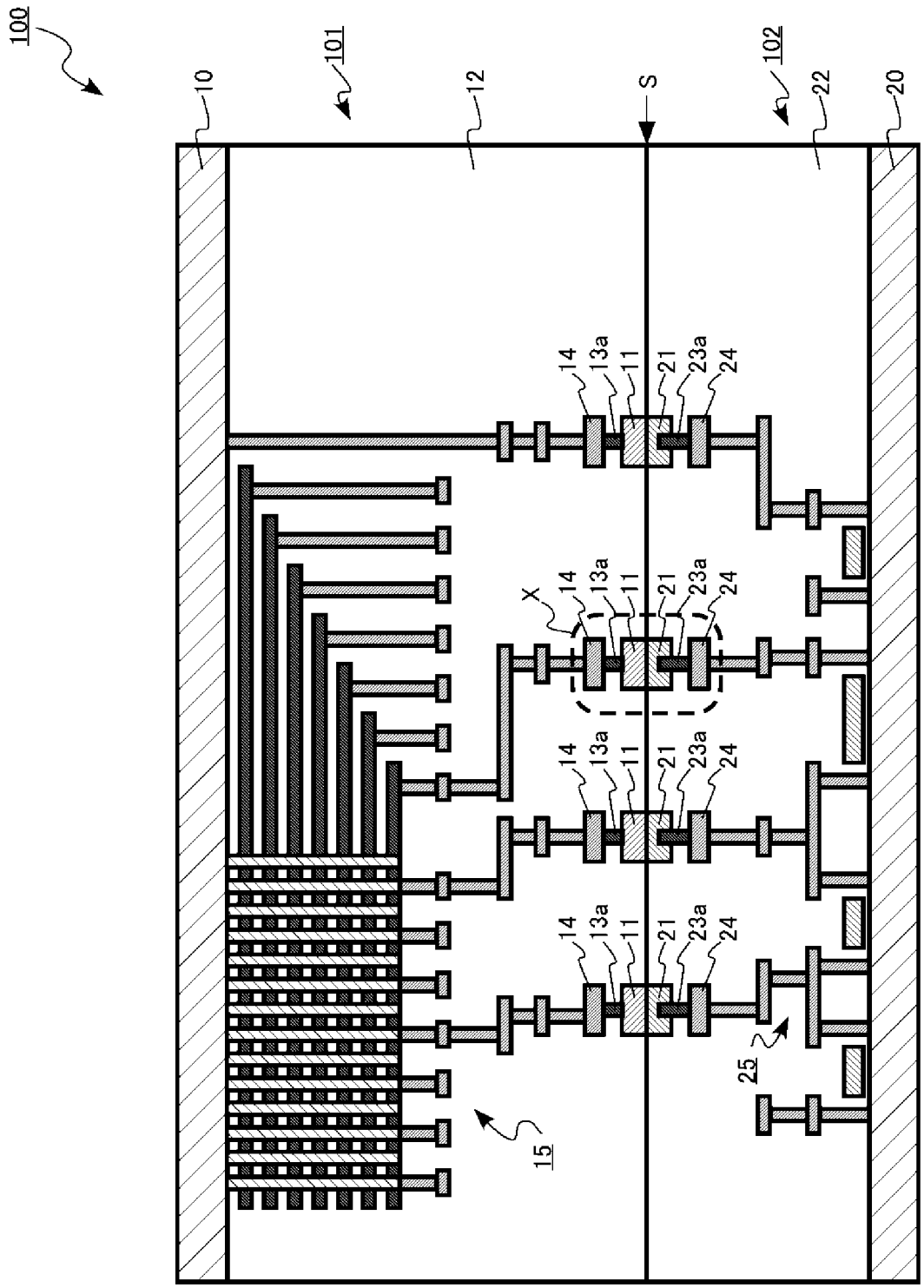
FIG. 1 depicts a semiconductor device in a schematic cross-sectional view according to a first embodiment.

According to one or more embodiments, a semiconductor device includes a first substrate and a second substrate. The first substrate includes a first metal layer and a first insulating layer. The first insulating layer surrounds the first metal layer. The second substrate includes a second metal layer, a second insulating layer, and a first conductive body. The first metal layer is in contact with the first metal layer. The second insulating layer surrounds the second metal layer and is in contact with the first insulating layer. The first conductive body is below the second metal layer and extends into is the second metal layer and in a first direction toward the first metal layer.

Certain example embodiments of the present disclosure will be described hereinafter with reference to the accompanying drawings. In the following descriptions, same or similar components, elements, members, and the like are denoted by the same reference signs or numerals.

In the example embodiments, terms, such as "upper" and "lower," are used for the sake of convenience. The terms "upper" and "lower" indicate a relative positional relationship in the drawings. The terms "upper" and "lower" do not necessarily specify a positional relationship relative to gravity.

A qualitative analysis and a quantitative analysis of chemical compositions of materials, regions, components, device elements, and the like of a semiconductor device in the present disclosure can be performed by, for example, Secondary Ion Mass Spectrometry (SIMS) or Energy Dispersive X-ray Spectroscopy (EDX). Thicknesses of the regions, components, device elements, or the like of a semiconductor device, distances between the regions, components, device elements, or the like, and the like can be measured by, for example, a Transmission Electron Microscope (TEM) or a Scanning Electron Microscope (SEM).

First Embodiment

A semiconductor device according to the first embodiment includes a first substrate with a first metal layer and a first insulating layer that surrounds the first metal layer. A second substrate has a second metal layer that comes in contact with the first metal layer when the substrates are bonded, a second insulating layer that surrounds the second metal layer and that comes in contact with the first insulating layer when the substrates are bonded. A first conductive body part is provided within the second metal layer and extends in a direction from the second metal layer toward the first metal layer.

FIG. 1 depicts a semiconductor device in a schematic cross-sectional view according to a first embodiment. The semiconductor device according to the first embodiment is a nonvolatile semiconductor memory 100. The nonvolatile semiconductor memory 100 is, for example, a three-dimensional NAND flash memory in which a plurality of memory cells are arranged three dimensionally.

The nonvolatile semiconductor memory 100 according to the first embodiment includes a memory chip 101 and a controller chip 102. The memory chip 101 is an example of a first substrate. The controller chip 102 is an example of a second substrate.

The memory chip 101 is joined to the controller chip 102 on a sticking interface S (bonding interface). The memory chip 101 and the controller chip 102 are joined together using a bonding technique.

The memory chip 101 includes a first semiconductor layer 10, a plurality of first metal pads 11, a first interlayer insulating layer 12, a plurality of first contact plugs 13a, a plurality of first interconnection layers 14 (also referred to as first wiring layers), and a memory cell array 15.

The controller chip 102 includes a second semiconductor layer 20, a plurality of second metal pads 21, a second interlayer insulating layer 22, a plurality of second contact plugs 23a, a plurality of second interconnection layers 24 (also referred to as second wiring layers), and a control circuit 25.

The first metal pad 11 is an example of a first metal layer. The first interlayer insulating layer 12 is an example of a first insulating layer. The first contact plug 13a is an example of a second conductive body.

The second metal pad 21 is an example of a second metal layer. The second interlayer insulating layer 22 is an example of a second insulating layer. The second contact plug 23a is an example of a first conductive body. The second interconnection layer 24 is an example of a conductive layer.

The first semiconductor layer 10 is made of, for example, single-crystal silicon (monocrystalline silicon).

The memory cell array 15 is provided between the first semiconductor layer 10 and the controller chip 102. For example, memory cells are arranged three dimensionally on the memory cell array 15.

The first metal pads 11 are each electrically connected to the memory cell array 15. The first metal pads 11 are each electrically connected to the memory cell array 15 by way of at least one first contact plug 13a and at least one first interconnection layer 14.

The first interlayer insulating layer 12 is provided between the first semiconductor layer 10 and the controller chip 102. The first interlayer insulating layer 12 has a function, for example, of providing electrical insulation of interconnections in the memory cell array 15, interconnections in the memory chip 101, and the like. The first interlayer insulating layer 12 contains, for example, silicon oxide.

The second semiconductor layer 20 is made of, for example, single-crystal silicon.

The control circuit 25 is provided between the second semiconductor layer 20 and the memory chip 101. The control circuit 25 includes semiconductor elements, such as a plurality of transistors, and a multilayer interconnection layer electrically connecting the semiconductor elements. The control circuit 25 controls the memory cell array 15.

The second metal pads 21 are each electrically connected to the control circuit 25. The second metal pads 21 are each electrically connected to the memory cell array 15 by way of at least one second contact plug 23a and at least one second interconnection layer 24.

The second interlayer insulating layer 22 is provided between the second semiconductor layer 20 and the memory chip 101. The second interlayer insulating layer 22 has a function, for example, of providing electrical insulation of the semiconductor elements in the control circuit 25, interconnections in the multilayer interconnection layer, and the like. The second interlayer insulating layer 22 contains, for example, silicon oxide.

Each of the second metal pads 21 is in contact with at least one first metal pad 11 at the sticking interface S. The second metal pad 21 is electrically connected to at least one first metal pad 11.

The memory chip 101 and the controller chip 102 are electrically connected to each other by way of the first metal pads 11 and the second metal pads 21.

An area denoted by the label "X" in FIG. 1 in the vicinity of the sticking interface S on which each first metal pad 11 is connected to each second metal pad 21 is referred to as a "connection area," herein or "connection area X".

Figure 2:
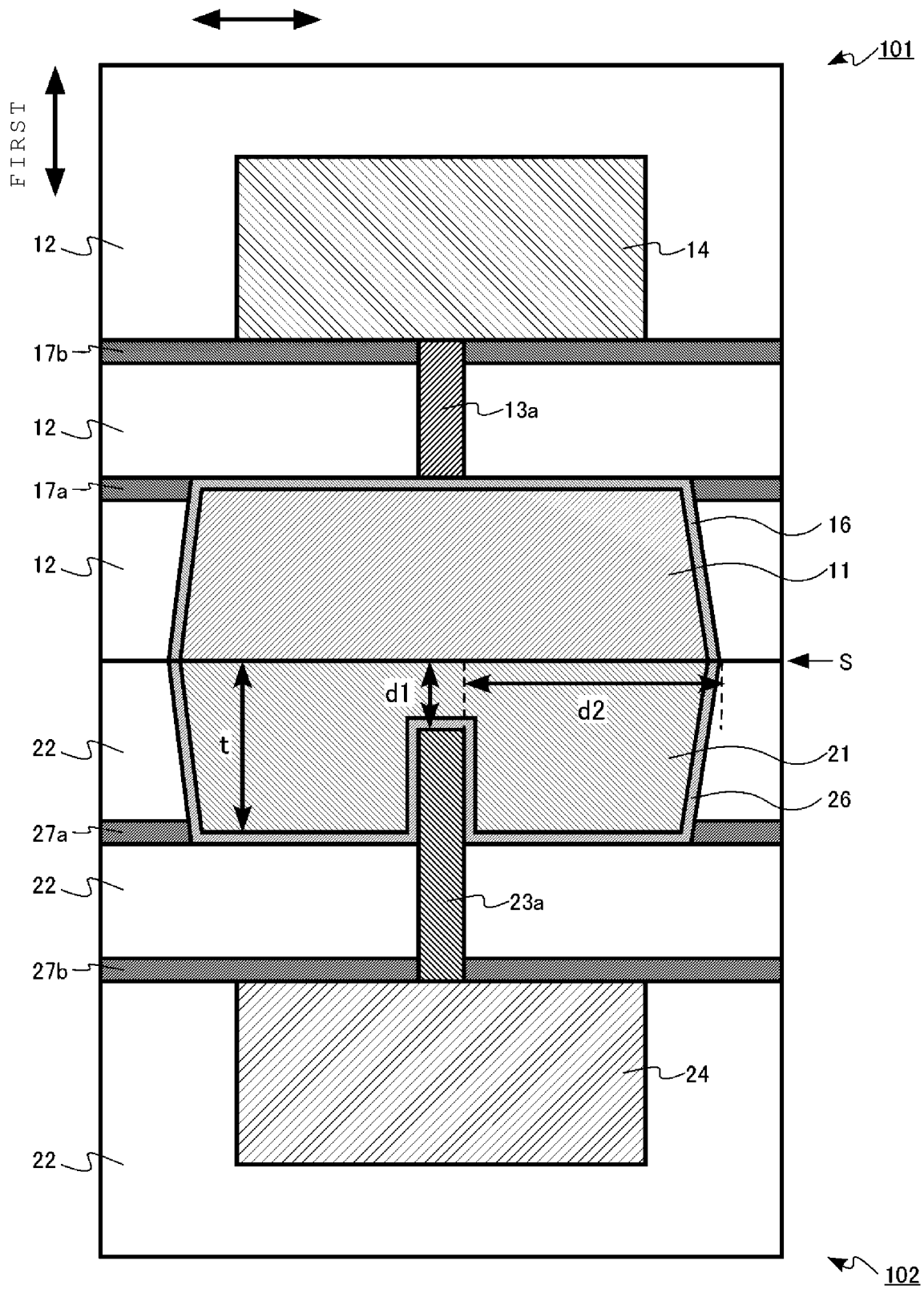
FIG. 2 depicts a connection area in a semiconductor device in a schematic cross-sectional view according to a first embodiment.

FIG. 2 depicts the connection area in the semiconductor device in a schematic cross-sectional view according to the first embodiment.

Part of the connection area on the memory chip 101 side in the nonvolatile semiconductor memory 100 includes the first metal pad 11, the first interlayer insulating layer 12, the first contact plug 13a, the first interconnection layer 14, a first barrier metal film 16, a first diffusion preventing film 17a, and a first diffusion preventing film 17b.

Part of the connection area on the controller chip 102 side in the nonvolatile semiconductor memory 100 includes the second metal pad 21, the second interlayer insulating layer 22, the second contact plug 23a, the second interconnection layer 24, a second barrier metal film 26, a second diffusion preventing film 27a, and a second diffusion preventing film 27b.

In this context, the first metal pad 11 is an example of a first metal layer. The first interlayer insulating layer 12 is an example of a first insulating layer. The first contact plug 13a is an example of a second conductive body. The second metal pad 21 is an example of a second metal layer. The second interlayer insulating layer 22 is an example of a second insulating layer. The second contact plug 23a is an example of a first conductive body. The second interconnection layer 24 is an example of a conductive layer. The second barrier metal film 26 is an example of a conductive film.

A direction from the second metal pad 21 toward the first metal pad 11 or vice versa is referred to as a first direction. A direction perpendicular to the first direction is referred to as a second direction.

The first metal pad 11 is surrounded by the first interlayer insulating layer 12. The first metal pad 11 is made of metal. In this example, the first metal pad 11 comprises copper (Cu). More particularly, in this example, the first metal pad 11 is metallic copper (Cu).

The first interconnection layer 14 is located above the first metal pad 11 in the first direction as illustrated in FIG. 2. The first interconnection layer 14 is surrounded by the first interlayer insulating layer 12. The first contact plug 13a is between the first interconnection layer 14 and the first metal pad 11.

The first interconnection layer 14 is a conductive body. The first interconnection layer 14 is, for example, a metal. The first interconnection layer 14 comprises, for example, copper (Cu) or tungsten (W).

The first contact plug 13a is provided between the first metal pad 11 and the first interconnection layer 14. The first contact plug 13a extends in the first direction. The first contact plug 13a is, for example, columnar. The first contact plug 13a is, for example, cylindrical columnar or truncated conical. The first contact plug 13a electrically connects the first metal pad 11 to the first interconnection layer 14.

The first contact plug 13a is a conductive body. The first contact plug 13a is, for example, a metal. In the present example, the first contact plug 13a comprises tungsten (W). More particularly, the first contact plug 13a is metallic tungsten (W) in this example.

The first barrier metal film 16 is provided between the first metal pad 11 and the first interlayer insulating layer 12. The first barrier metal film 16 is provided between the first metal pad 11 and the first contact plug 13a. The first barrier metal film 16 has a function of preventing diffusion of the metal contained in the first metal pad 11 into the first interlayer insulating layer 12.

The first barrier metal film 16 is a conductive body. The first barrier metal film 16 is, for example, a metal or a metal nitride.

The first barrier metal film 16 comprises at least one metallic element. For example, the first barrier metal film 16 includes at least one metallic element selected from among a group consisting of titanium (Ti), tantalum (Ta), manganese (Mn), and cobalt (Co). The first barrier metal film 16 is, for example, a titanium film, a titanium nitride film, or a tantalum nitride film.

The thickness of the first barrier metal film 16 is, for example, 10 nm to 30 nm.

The first diffusion preventing film 17a is provided in the first interlayer insulating layer 12. The first diffusion preventing film 17b is provided in the first interlayer insulating layer 12. The first diffusion preventing film 17a and the first diffusion preventing film 17b each have a function of preventing the diffusion of the metal in the first metal pad 11 or the first interconnection layer 14 into the first interlayer insulating layer 12.

The second metal pad 21 is surrounded by the second interlayer insulating layer 22. The second metal pad 21 is in contact with the first metal pad 11 at the sticking interface S.

The second metal pad 21 is a metal. The second metal pad 21 comprises, for example, copper (Cu). The second metal pad 21 is, for example, copper (Cu).

The second interconnection layer 24 is located below the second metal pad 21 in the first direction as illustrated in FIG. 2. The second interconnection layer 24 is surrounded by the second interlayer insulating layer 22. The second contact plug 23a is between the second interconnection layer 24 and the second metal pad 21.

The second interconnection layer 24 is a conductive body. The second interconnection layer 24 is, for example, a metal. The second interconnection layer 24 comprises, for example, copper (Cu) or tungsten (W).

The second contact plug 23a is provided between the second metal pad 21 and the second interconnection layer 24. The second contact plug 23a extends in the first direction. The second contact plug 23a is, for example, columnar. The second contact plug 23a is, for example, cylindrical columnar or truncated conical. The second contact plug 23a electrically connects the second metal pad 21 to the second interconnection layer 24.

Part of the second contact plug 23a is provided in the second metal pad 21. An end portion of the second contact plug 23a closer to the first metal pad 11 is provided in the second metal pad 21. The part of the second contact plug 23a is surrounded by the second metal pad 21. The end portion of the second contact plug 23a closer to the first metal pad 11 is surrounded by the second metal pad 21.

The second contact plug 23a is apart from the first metal pad 11 in the first direction. The second metal pad 21 is provided between the second contact plug 23a and the first metal pad 11.

A distance, which is denoted by the label "d1" in FIG. 2, between the second contact plug 23a and the first metal pad 11 in the first direction is less than a thickness, which is denoted by the label "t" in FIG. 2, of the second metal pad 21 in the first direction. The distance d1 between the second contact plug 23a and the first metal pad 11 in the first direction is, for example, equal to or less than a half of the thickness t of the second metal pad 21 in the first direction.

The distance d1 between the second contact plug 23a and the first metal pad 11 in the first direction is shorter than a distance, which is denoted by the label "d2" in FIG. 2, from an interface between the first interlayer insulating layer 12 and the second interlayer insulating layer 22 to the second contact plug 23a in the second direction.

The second contact plug 23a is a conductive body. The second contact plug 23a is, for example, a metal. The second contact plug 23a comprises, for example, tungsten (W). The second contact plug 23a is, for example, metallic tungsten (W).

The second barrier metal film 26 is provided between the second metal pad 21 and the second interlayer insulating layer 22. The second barrier metal film 26 is provided between the second metal pad 21 and the second contact plug 23a.

The second barrier metal film 26 surrounds the second contact plug 23a in the second metal pad 21. The second barrier metal film 26 is provided on side and upper surfaces of the second contact plug 23a present in the second metal pad 21.

The second barrier metal film 26 has a function, for example, of preventing diffusion of the metal contained in the second metal pad 21 to the second interlayer insulating layer 22.

The second barrier metal film 26 is a conductive body. The second barrier metal film 26 is, for example, a metal or a metal nitride.

The second barrier metal film 26 comprises at least one metallic element. For example, the second barrier metal film comprises at least one metallic element selected from among a group consisting of titanium (Ti), tantalum (Ta), manganese (Mn), and cobalt (Co). The second barrier metal film 26 is, for example, a titanium film, a titanium nitride film, or a tantalum nitride film.

The thickness of the second barrier metal film 26 is, for example, 10 nm to 30 nm.

The second diffusion preventing film 27a is provided in the second interlayer insulating layer 22. The second diffusion preventing film 27b is provided in the second interlayer insulating layer 22. The second diffusion preventing film 27a and the second diffusion preventing film 27b each have a function, for example, of preventing diffusion of the metal contained in the second metal pad 21 or the second interconnection layer 24 to the second interlayer insulating layer 22.

An example of a method of manufacturing the semiconductor device according to the first embodiment will next be described. FIGS. 3 to 13 are schematic cross-sectional views depicting aspects related to the method of manufacturing the semiconductor device according to the first embodiment.

Description of the manufacturing method will primarily focus on aspects related to the connection area X in the nonvolatile semiconductor memory 100.

The manufacturing of part of the connection area X on the memory chip 101 side will first be described.

Figure 3:
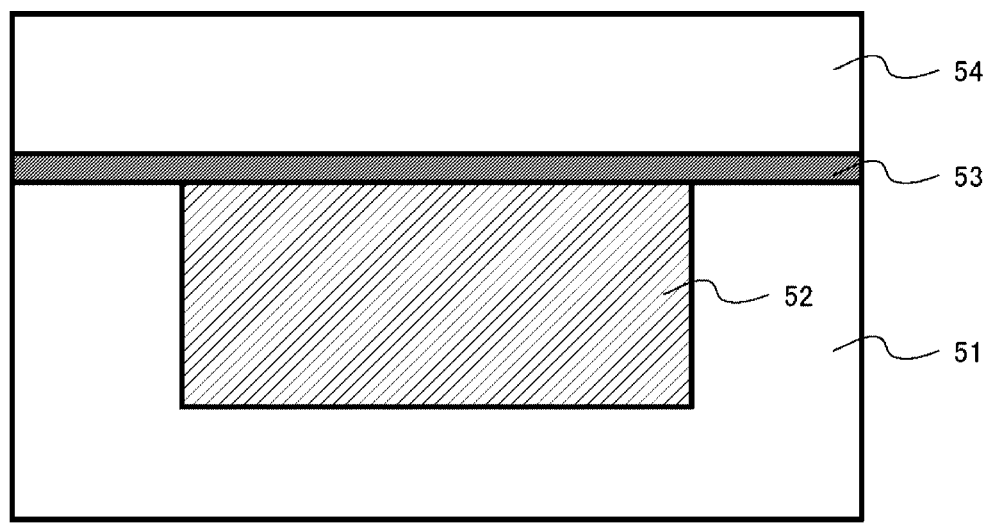
FIGS. 3 to 13 are schematic cross-sectional views depicting aspects related to a method of manufacturing a semiconductor device according to a first embodiment.

As shown in FIG. 3, a tungsten layer 52 is formed in a silicon oxide film 51. A silicon nitride film 53 and a silicon oxide film 54 are then formed on the silicon oxide film 51 and the tungsten layer 52.

The silicon oxide films 51 and 54 serve as part of the first interlayer insulating layer 12. The silicon nitride film 53 serves as the first diffusion preventing film 17b. The tungsten layer 52 serves as the first interconnection layer 14.

Figure 4:
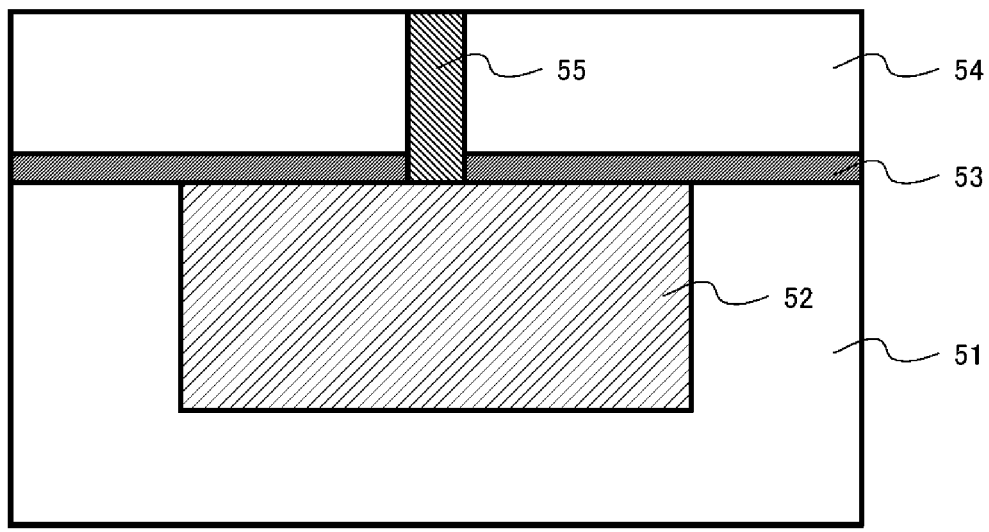

Next, as shown in FIG. 4, the silicon oxide film 54 and the silicon nitride film 53 are etched, and a contact hole reaching the tungsten layer 52 is formed. The formed contact hole is then filled with a tungsten film 55. The tungsten film 55 ultimately serves as the first contact plug 13a.

Figure 5:
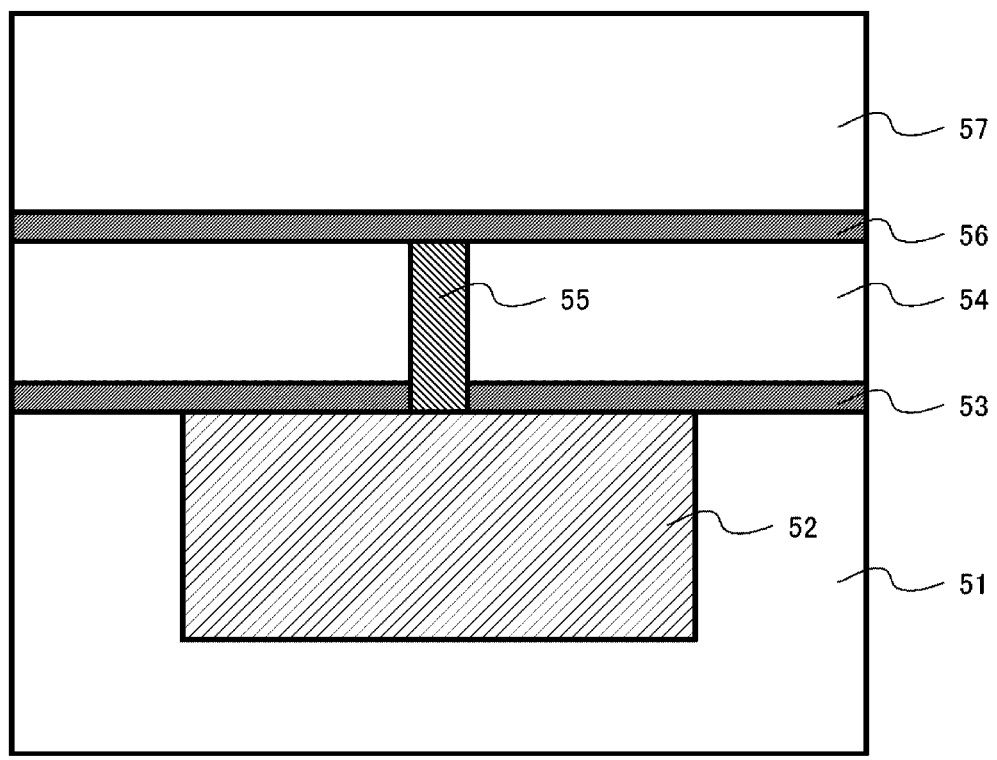

Next, as shown in FIG. 5, another silicon nitride film and another silicon oxide film 57 are formed on the silicon oxide film 54 and the tungsten film 55. The silicon nitride film 56 eventually serves as the first diffusion preventing film 17a. The silicon oxide film 57 eventually serves as part of the first interlayer insulating layer 12.

Figure 6:
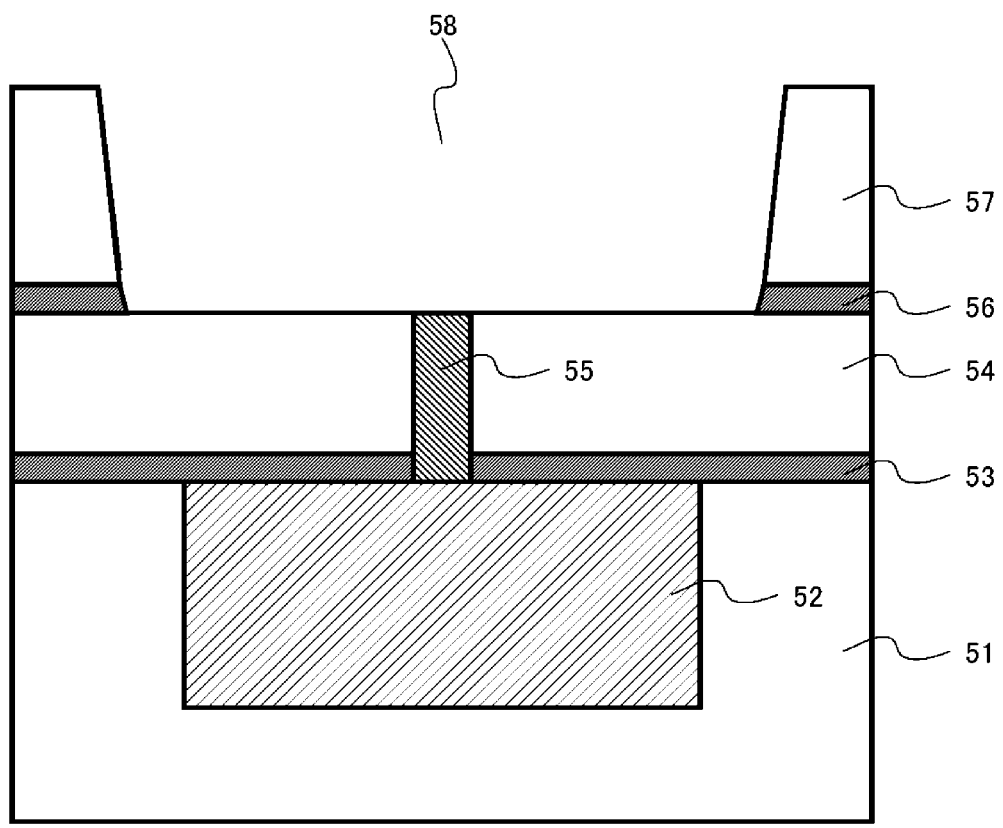

Next, as shown in FIG. 6, the silicon oxide film 57 and the silicon nitride film 56 are etched, and an opening 58 is formed. The tungsten film 55 is exposed at the bottom of the opening 58.

Figure 7:
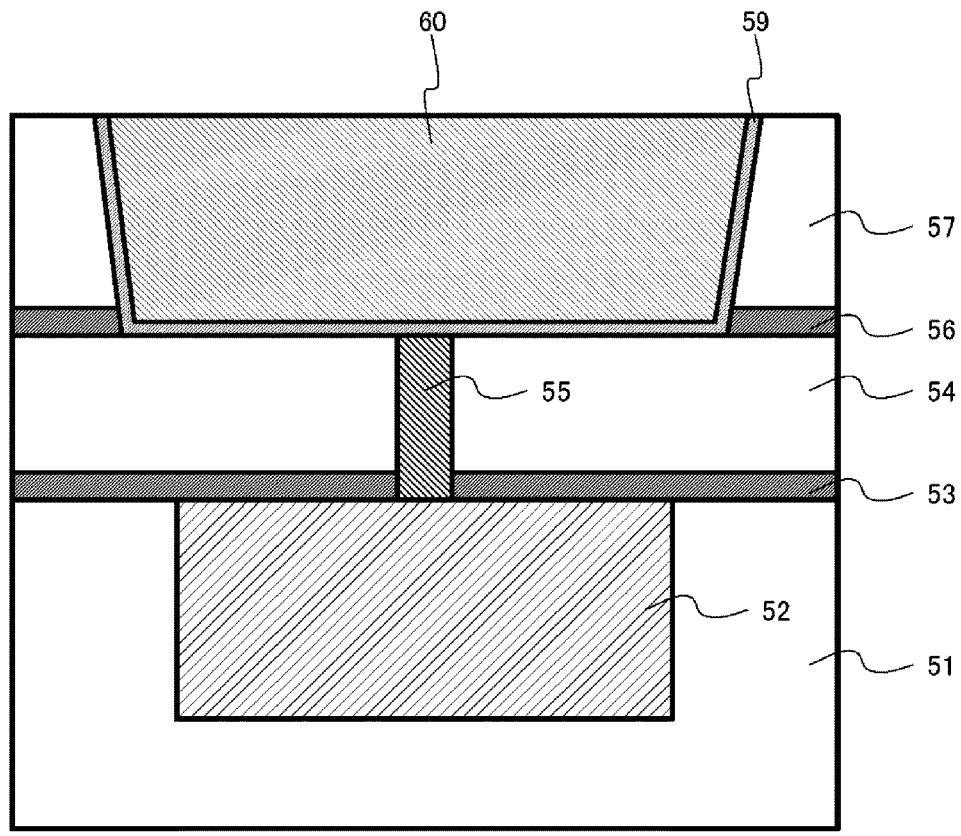

Next, as shown in FIG. 7, a titanium film 59 and a copper film 60 are formed in the opening 58. An exposed surface of the copper film 60 is planarized by, for example, a Chemical Mechanical Polishing (CMP) method.

The titanium film 59 serves as the first barrier metal film 16. The copper film 60 ultimately serves as the first metal pad 11.

Accordingly, the part of the connection area X on the memory chip 101 side (may also be referred to as "memory chip 101-side part") is formed.

The manufacturing of part of the connection area X on the controller chip 102 side will next be described.

Figure 8:
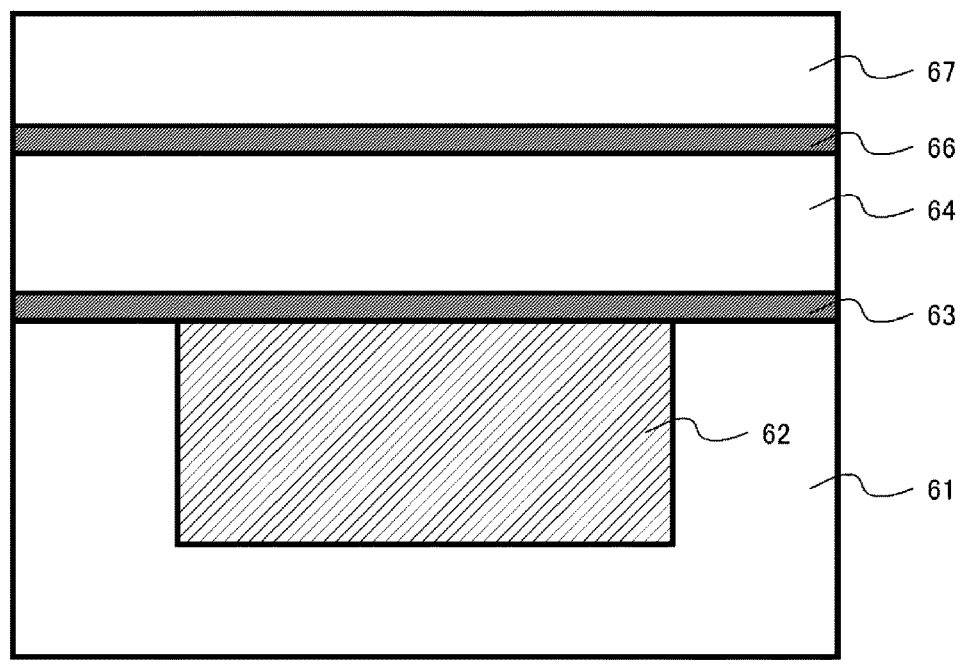

As shown in FIG. 8, a tungsten layer 62 is formed in a silicon oxide film 61. A silicon nitride film 63, a silicon oxide film 64, a silicon nitride film 66, and a silicon oxide film 67 are then formed on the silicon oxide film 61 and the tungsten layer 62.

The silicon oxide films 61, 64, and 67 ultimately serve as part of the second interlayer insulating layer 22. The silicon nitride film 63 ultimately serves as the first diffusion preventing film 27b. The silicon nitride film 66 ultimately serves as the first diffusion preventing film 27a. The tungsten layer 62 eventually serves as the second interconnection layer 24.

Figure 9:
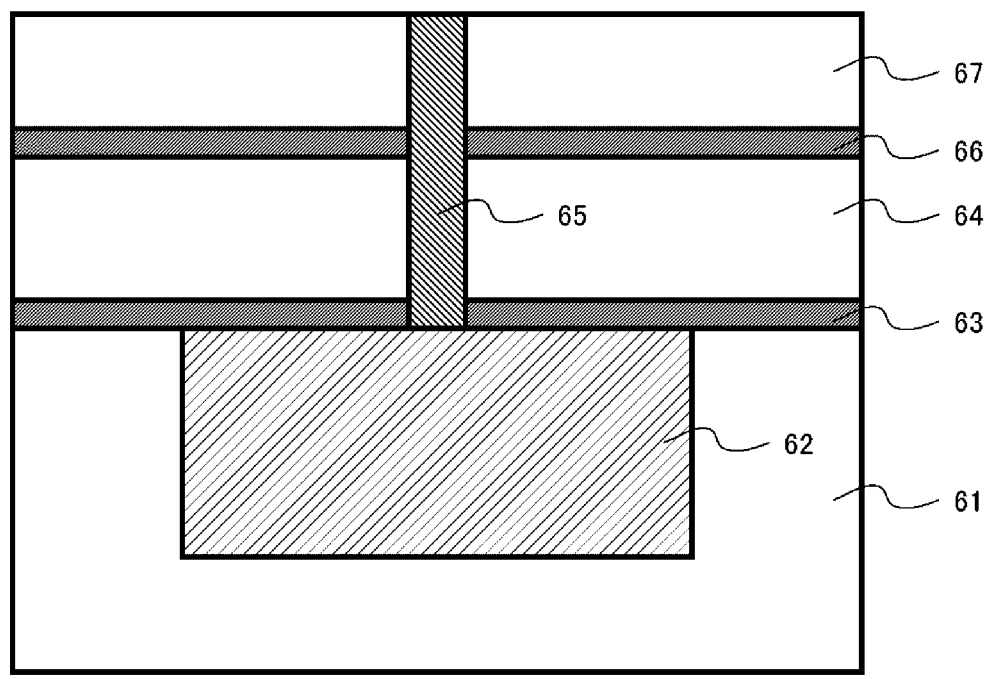

Next, as shown in FIG. 9, the silicon oxide film 67, the silicon nitride film 66, the silicon oxide film 64, and the silicon nitride film 63 are etched, and a contact hole reaching the tungsten layer 62 is formed. The formed contact hole is then filled with a tungsten film 65. The tungsten film 65 ultimately serves as the second contact plug 23a.

Figure 10:
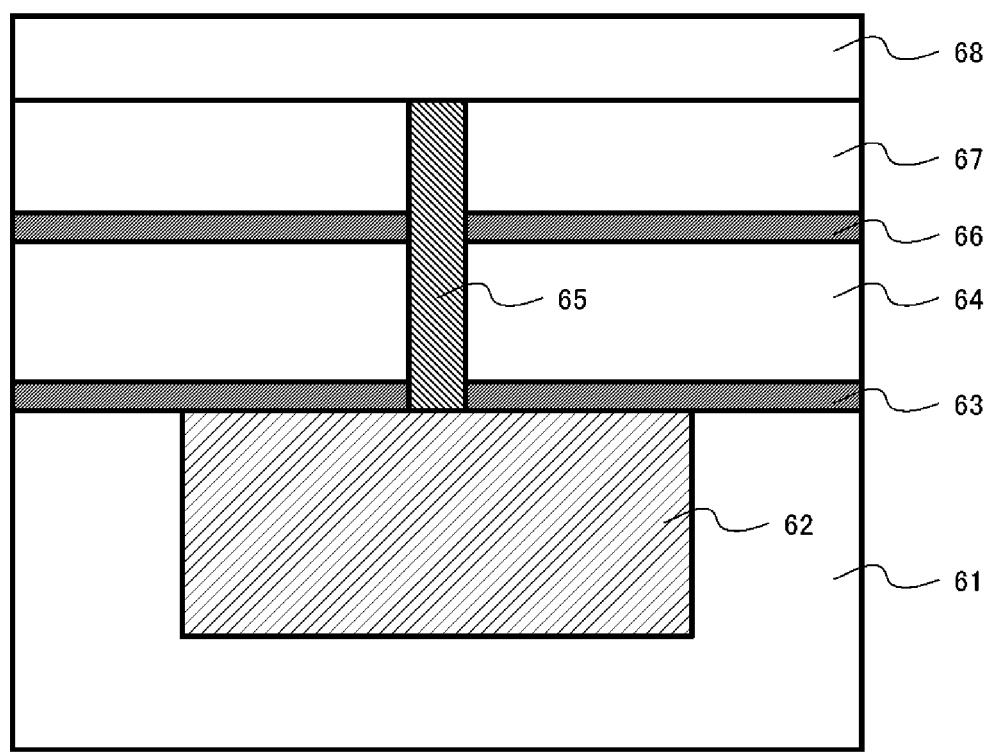

Next, as shown in FIG. 10, another silicon oxide film 68 is formed on the silicon oxide film 67 and the tungsten film 65. The silicon oxide film 68 eventually serves as part of the second interlayer insulating layer 22.

Figure 11:
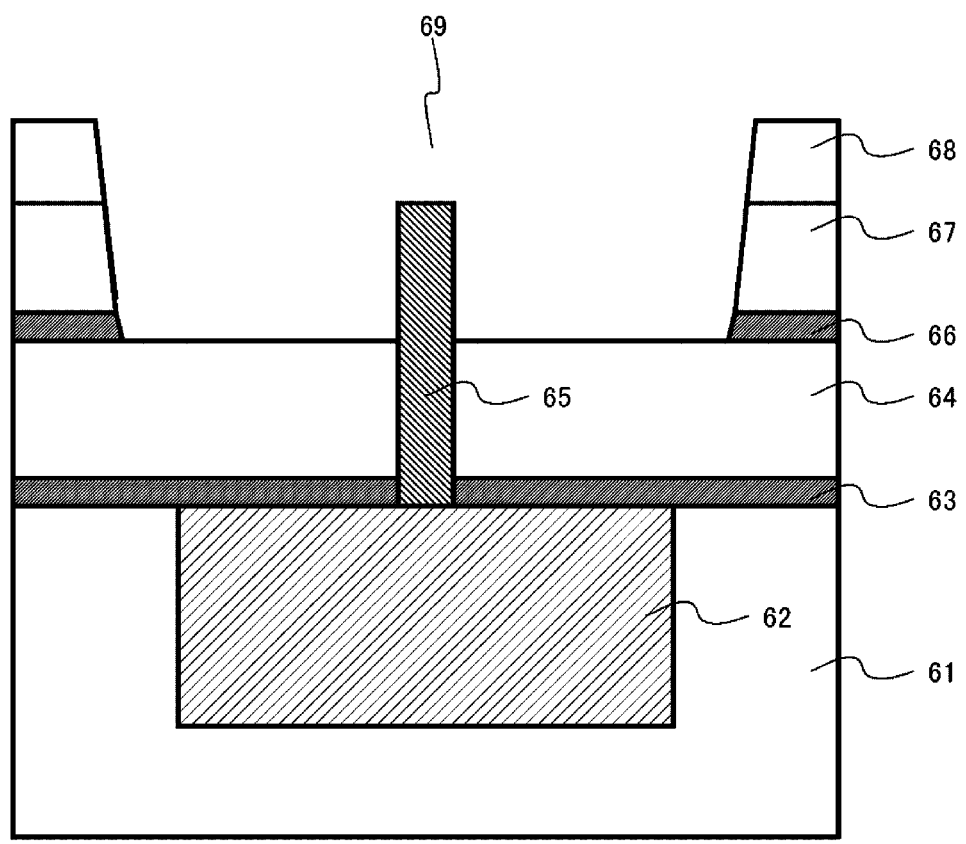

Next, as shown in FIG. 11, the silicon oxide film 68, the silicon oxide film 67, and the silicon nitride film 66 are etched, and an opening 69 is formed. An upper portion of the tungsten film 65 protrudes in the opening 69.

Figure 12:
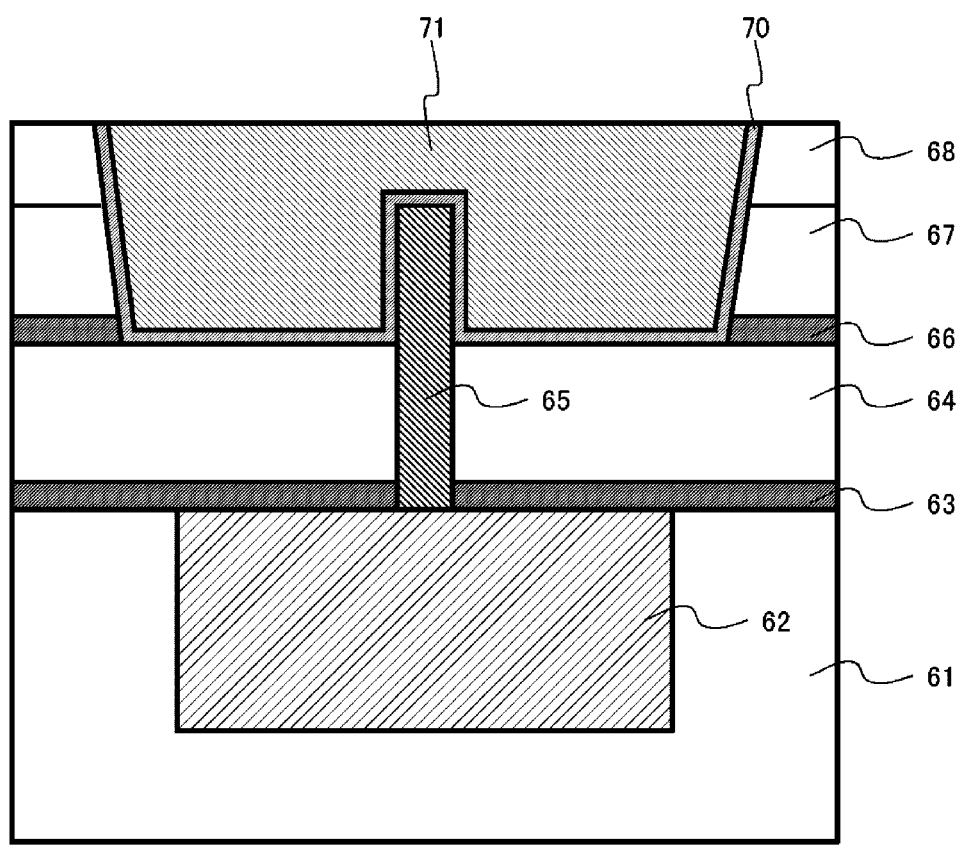

Next, as shown in FIG. 12, a titanium film 70 and a copper film 71 are formed in the opening 69. An exposed surface of the copper film 71 is planarized by, for example, the CMP method. The upper portion of the tungsten film 65 protrudes into the copper film 71.

The titanium film 70 eventually serves as the second barrier metal film 26. The copper film 71 serves as the second metal pad 21.

Accordingly, the part of the connection area X on the controller chip 102 side (may also be referred to as "controller chip 102-side part") is formed.

Figure 13:
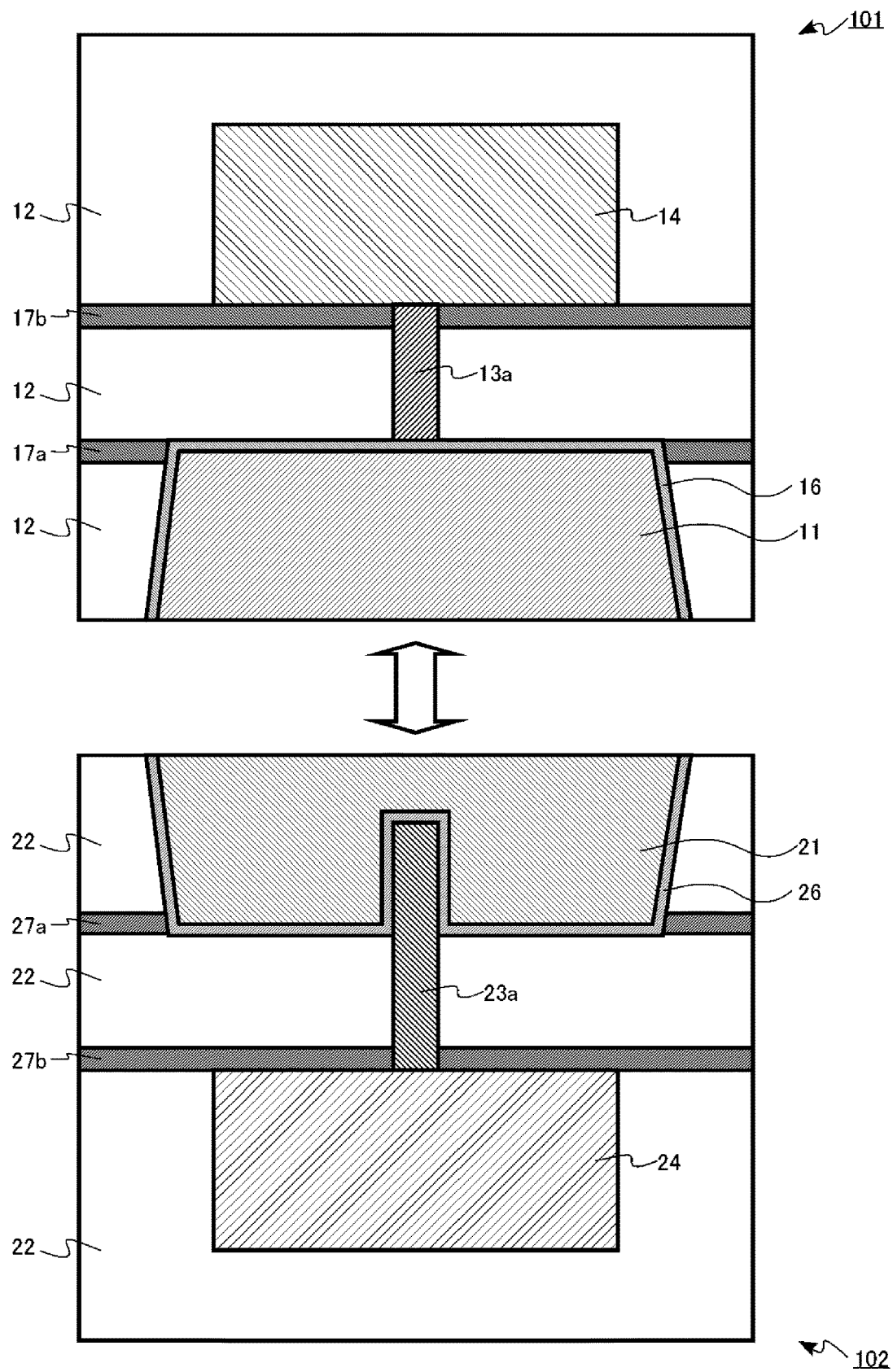

Subsequently, as shown in FIG. 13, the controller chip 102-side part and the memory chip 101-side part of the connection area X are bonded together in such a manner that the second metal pad 21 faces the first metal pad 11. The controller chip 102-side part and the memory chip 101-side part of the connection area X are bonded together by a mechanical pressure. A heat treatment is then performed, thereby joining or fusing the two parts.

Accordingly, the connection area X in the nonvolatile semiconductor memory 100 can be manufactured.

Operations and advantageous effects of the semiconductor device according to the first embodiment will next be described. As one example, a case where both the first metal pad 11 and the second metal pad 21 are copper (Cu) and the first barrier metal film 16 and the second barrier metal film 26 are titanium films a metallic element will be described.

Figure 14:
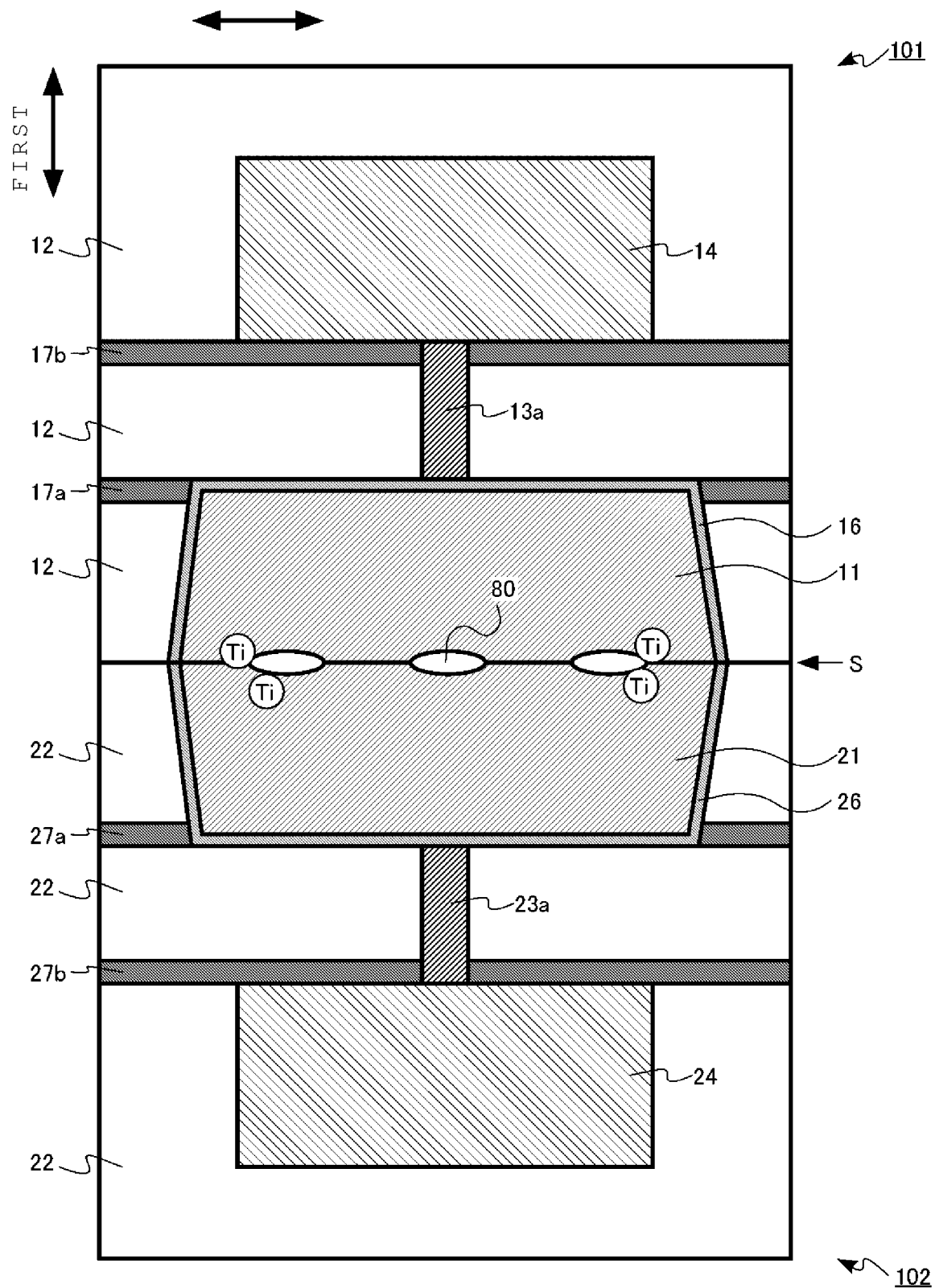
FIG. 14 is an explanatory diagram of a semiconductor device according to a comparison example.

FIG. 14 is an explanatory diagram of a semiconductor device according to a comparison example. The connection area in the comparison example shown in FIG. 14 differs from the connection area X in the nonvolatile semiconductor memory 100 according to the first embodiment in that a first conductive body is not provided in a second metal layer. That is, in the comparative example, the second contact plug 23a does not extend into the second metal pad 21.

The connection area according to the comparison example is manufactured by forming the controller chip 102-side part of the connection area by a method that is substantially the same as or similar to that of forming the memory chip 101-side part of the connection area X in the nonvolatile semiconductor memory 100 according to the first embodiment.

As shown in FIG. 14, in the connection area according to the comparison example, voids 80 (or cavities) are frequently generated at the sticking interface S between the first metal pad 11 and the second metal pad 21. The voids 80 at the sticking interface S possibly causes a reduction in an electromigration resistance of the connection area. There is a risk of growth of the voids 80, an increase in a contact resistance between the first metal pad 11 and the second metal pad 21, and disconnection between the first metal pad and the second metal pad 21 by electromigration. The reduction in the electromigration resistance of the connection area results in a reduction in reliability of the nonvolatile semiconductor memory 100.

If titanium is contained in the first barrier metal film 16 and the second barrier metal film 26, the electromigration resistance of the connection area can be improved by diffusion and segregation of titanium to the voids 80 and the sticking interface S. The presence of titanium atoms at a grain boundary of copper (Cu) is considered to prevent or suppress movement of the copper atoms.

Figure 15:
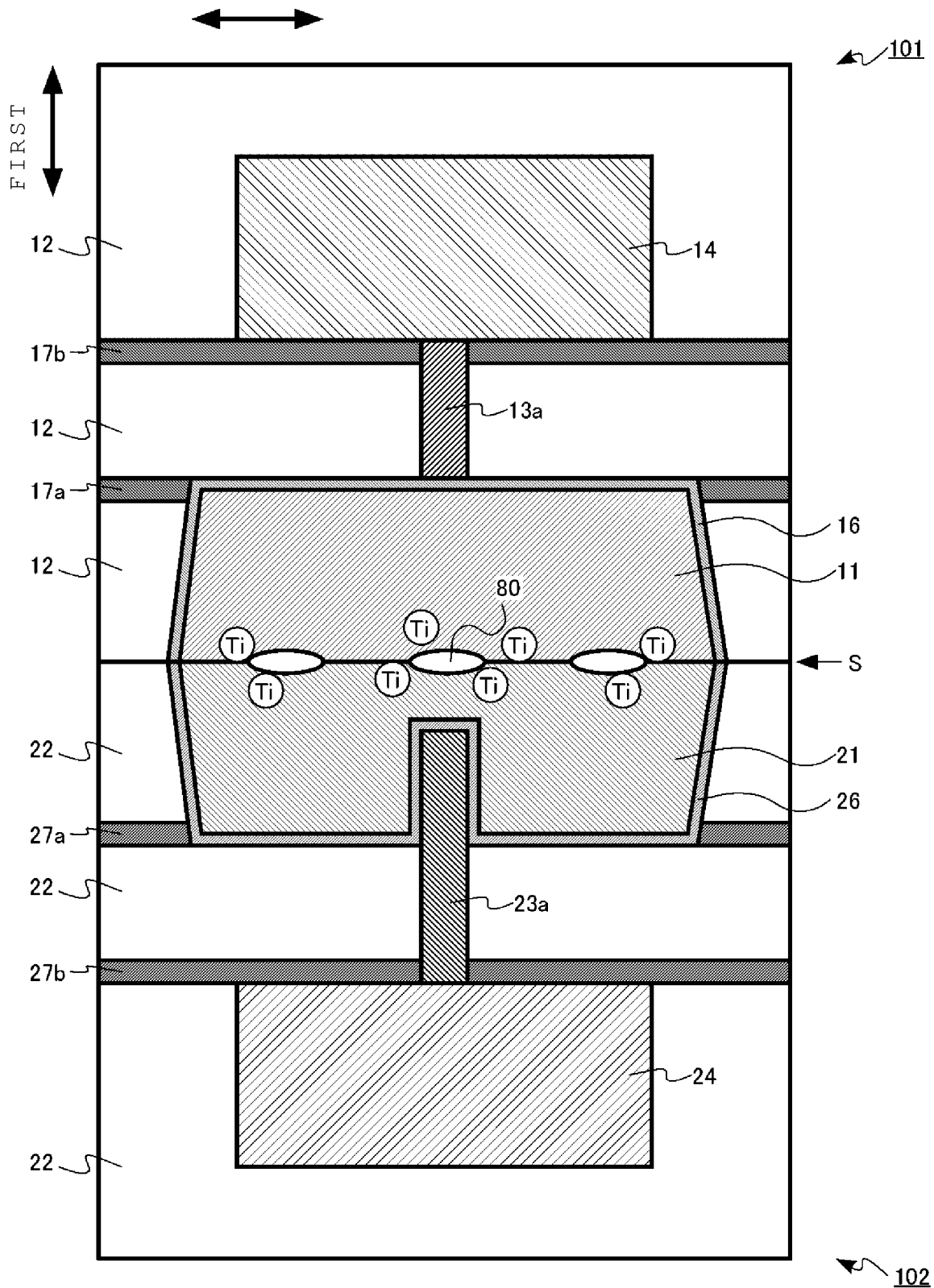
FIG. 15 is an explanatory diagram of a semiconductor device according to a first embodiment.

FIG. 15 is an explanatory diagram of the semiconductor device according to the first embodiment. FIG. 15 shows the connection area X in a schematic cross-sectional view.

In the connection area X in the nonvolatile semiconductor memory 100 according to the first embodiment, at least part of the second contact plug 23a is provided within the second metal pad 21. The second barrier metal film 26 (containing titanium) is provided between the second contact plug 23a and the second metal pad 21.

Providing a portion of the second contact plug 23a inside the second metal pad 21 provides an additional supply source for titanium atoms in the vicinity of the sticking interface S between the first metal pad 11 and the second metal pad 21. Therefore, a feed rate of titanium to the voids 80 and the sticking interface S increases, as compared with the connection area according to the comparison example. Hence, the electromigration resistance of the connection area X improves and the reliability of the nonvolatile semiconductor memory 100 improves.

Referring back to FIG. 2, in one instance, the distance, which is denoted by d1 in FIG. 2, between the second contact plug 23a and the first metal pad 11 in the first direction is preferably equal to or less than a half of the thickness, which is denoted by t in FIG. 2, of the second metal pad 21 in the first direction. In another instance, the distance d1 may be equal to or less than one-third of the thickness t. In still another instance, the distance d1 may be equal to or less than one-quarter of the thickness t. Making the second barrier metal film 26 between the second contact plug 23a and the first metal pad 11 closer to the sticking interface S achieves an increase in the feed rate of titanium to the voids 80 and the sticking interface S and the further improvement in the electromigration resistance of the connection area X.

The distance d1 between the second contact plug 23a and the first metal pad 11 in the first direction may be shorter than the distance, which is denoted by d2 in FIG. 2, from the interface between the first interlayer insulating layer 12 and the second interlayer insulating layer 22 to the second contact plug 23a in the second direction. Placing the portion of the second barrier metal film 26 that is between the second contact plug 23a and the first metal pad 11 closer to the sticking interface S than the portion of the second barrier metal film 26 that is between the second interlayer insulating layer 22 and the first metal pad 11 achieves an increase in the feed rate of titanium to the voids 80 and the sticking interface S and the further improvement in the electromigration resistance of the connection area X.

The metallic element contained in the first barrier metal film 16 and the second barrier metal film 26 is not limited to titanium (Ti). The metallic element may be, for example, tantalum (Ta), manganese (Mn), or cobalt (Co). The operations and advantageous effects of such a case can be substantially the same as or similar to those in the case of using titanium (Ti).

According to the first embodiment, it is possible to provide a semiconductor device with an improvement in electromigration resistance and an improvement in the reliability.

Second Embodiment

A semiconductor device according to a second embodiment differs from the semiconductor device according to the first embodiment in that the first substrate further includes a second conductive body, at least part of which is provided in the first metal layer and which extends in the first direction.

Figure 16:
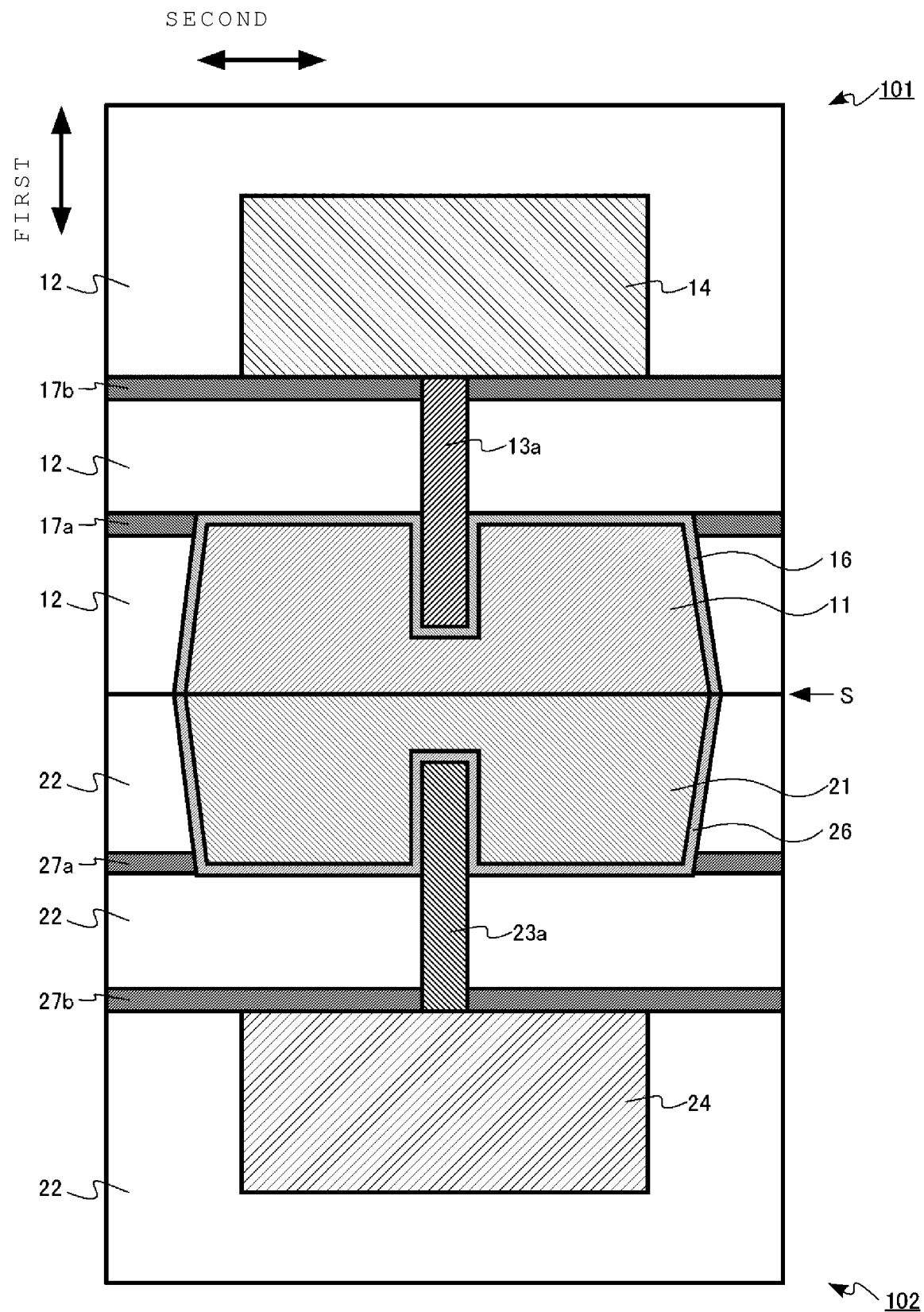
FIG. 16 depicts a connection area in a semiconductor device in a schematic cross-sectional view according to a second embodiment.

FIG. 16 shows the connection area in the semiconductor device according to the second embodiment in a schematic cross-sectional view.

The memory chip 101-side part of the connection area in the nonvolatile semiconductor memory according to the second embodiment includes the first metal pad 11, the first interlayer insulating layer 12, the first contact plug 13a, the first interconnection layer 14, the first barrier metal film 16, the first diffusion preventing film 17a, and the first diffusion preventing film 17b.

The controller chip 102-side part of the connection area in the nonvolatile semiconductor memory according to the second embodiment includes the second metal pad 21, the second interlayer insulating layer 22, the second contact plug 23a, the second interconnection layer 24, the second barrier metal film 26, the second diffusion preventing film 27a, and the second diffusion preventing film 27b.

In this context, the first metal pad 11 is an example of a first metal layer. The first interlayer insulating layer 12 is an example of a first insulating layer. The first contact plug 13a is an example of a second conductive body.

The second metal pad 21 is an example of a second metal layer. The second interlayer insulating layer 22 is an example of a second insulating layer. The second contact plug 23a is an example of a first conductive body. The second interconnection layer 24 is an example of a conductive layer. The second barrier metal film 26 is an example of a conductive film.

Part of the first contact plug 13a is provided in the first metal pad 11. An end portion of the first contact plug 13a that is closer to the second metal pad 21 is provided in the first metal pad 11. The part of the first contact plug 13a is surrounded by the first metal pad 11. The end portion of the first contact plug 13a closer to the second metal pad 21 is surrounded by the first metal pad 11.

The first contact plug 13a is spaced apart from the second metal pad 21 in the first direction. The first metal pad 11 is provided between the first contact plug 13a and the second metal pad 21.

A distance between the first contact plug 13a and the second metal pad 21 in the first direction is less than the thickness of the first metal pad 11 in the first direction. The distance between the first contact plug 13a and the second metal pad 21 in the first direction is, for example, equal to or less than a half of the thickness of the first metal pad 11 in the first direction.

In the connection area according to the second embodiment, providing at least part of the first contact plug 13a in the first metal pad 11 achieves a further increase in feed rate of titanium to the voids 80 and the sticking interface S, as compared with the first embodiment.

Therefore, the electromigration resistance further improves.

According to the second embodiment, it is possible to provide a semiconductor device with further improvement in electromigration resistance and reliability.

Third Embodiment

A semiconductor device according to a third embodiment differs from the semiconductor device according to the second embodiment in that the second substrate further includes a third conductive body, at least part of which is provided in the second metal layer. The third conductive body extends from the second metal layer in the first direction.

Figure 17:
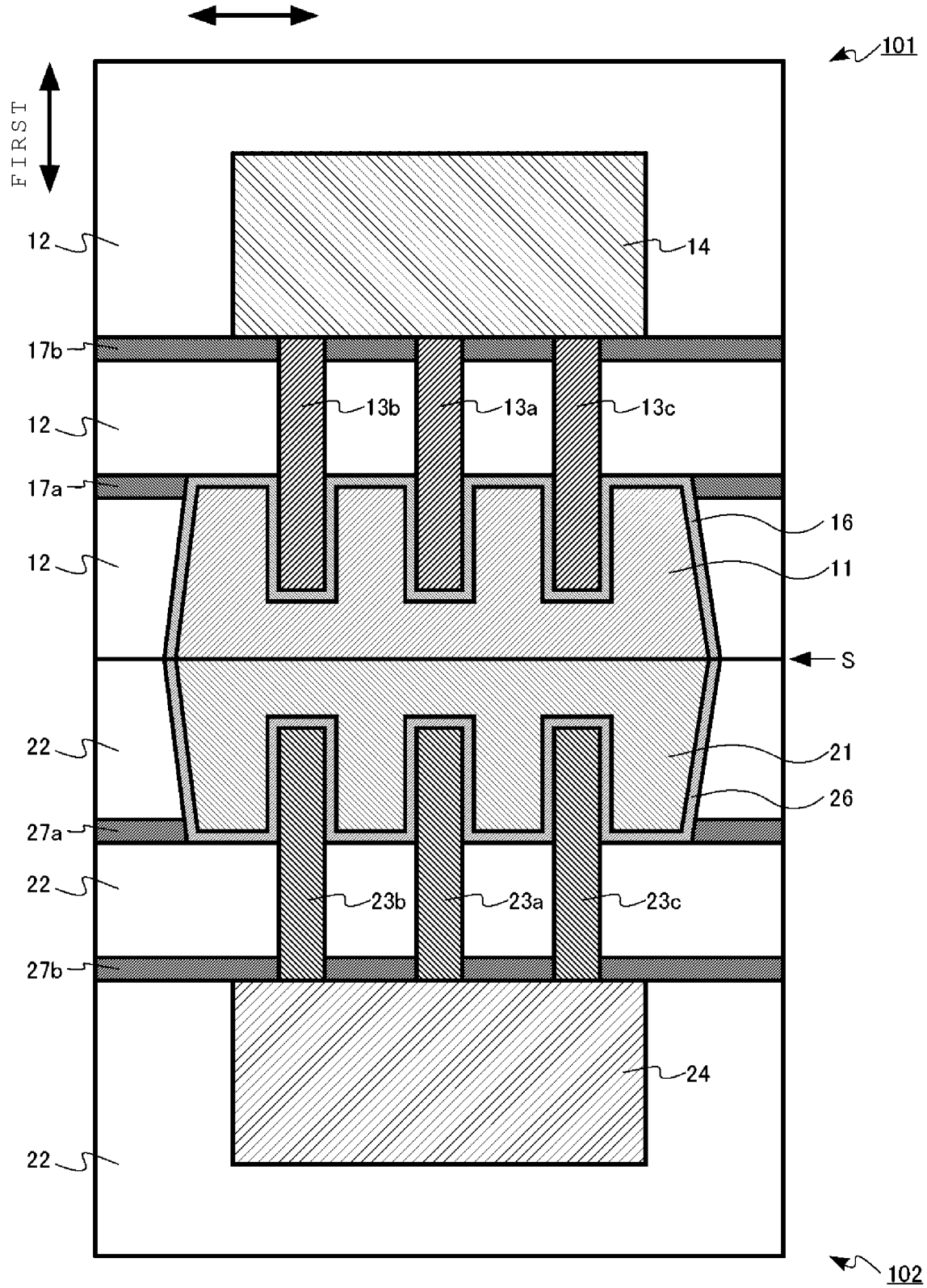
FIG. 17 depicts a connection area in a semiconductor device in a schematic cross-sectional view according to a third embodiment.

FIG. 17 depicts the connection area in the semiconductor device according to the third embodiment in a schematic cross-sectional view.

The memory chip 101-side part of the connection area in the nonvolatile semiconductor memory according to the third embodiment includes the first metal pad 11, the first interlayer insulating layer 12, the first contact plug 13a, a first contact plug 13b, a first contact plug 13c, the first interconnection layer 14, the first barrier metal film 16, the first diffusion preventing film 17a, and the first diffusion preventing film 17b.

The controller chip 102-side part of the connection area in the nonvolatile semiconductor memory according to the third embodiment includes the second metal pad 21, the second interlayer insulating layer 22, the second contact plug 23a, a second contact plug 23b, a second contact plug 23c, the second interconnection layer 24, the second barrier metal film 26, the second diffusion preventing film 27a, and the second diffusion preventing film 27b.

In this context, the first metal pad 11 is an example of a first metal layer. The first interlayer insulating layer 12 is an example of a first insulating layer. The first contact plug 13a is an example of a second conductive body. The second metal pad 21 is an example of a second metal layer. The second interlayer insulating layer 22 is an example of a second insulating layer. The second contact plug 23a is an example of a first conductive body. Each of the second contact plugs 23b and 23c is an example of the third conductive body. The second interconnection layer 24 is an example of the conductive layer. The second barrier metal film 26 is an example of the conductive film.

Part of the first contact plug 13a is provided in the first metal pad 11. Part of the first contact plug 13b is provided in the first metal pad 11. Part of the first contact plug 13c is provided in the first metal pad 11.

Part of the second contact plug 23a is provided in the second metal pad 21. Part of the second contact plug 23b is provided in the second metal pad 21. Part of the second contact plug 23c is provided in the second metal pad 21.

In the connection area according to the third embodiment, the number of first contact plugs in the first metal pad 11 is three. The number of second contact plugs in the second metal pad 21 is three. With this configuration, the feed rate of titanium to the voids 80 and the sticking interface S further increases as compared to the second embodiment. Hence, the electromigration resistance further improves.

In other examples, the number of first contact plugs in the first metal pad 11 may be two or four or more. Likewise, the number of second contact plugs in the second metal pad 21 may be two or four or more.

According to the third embodiment, it is possible to provide the semiconductor device with further improvement in electromigration resistance and reliability.

Fourth Embodiment

A semiconductor device according to a fourth embodiment differs from the semiconductor device according to the first embodiment in that part of a first conductive body extends into the first metal layer.

Figure 18:
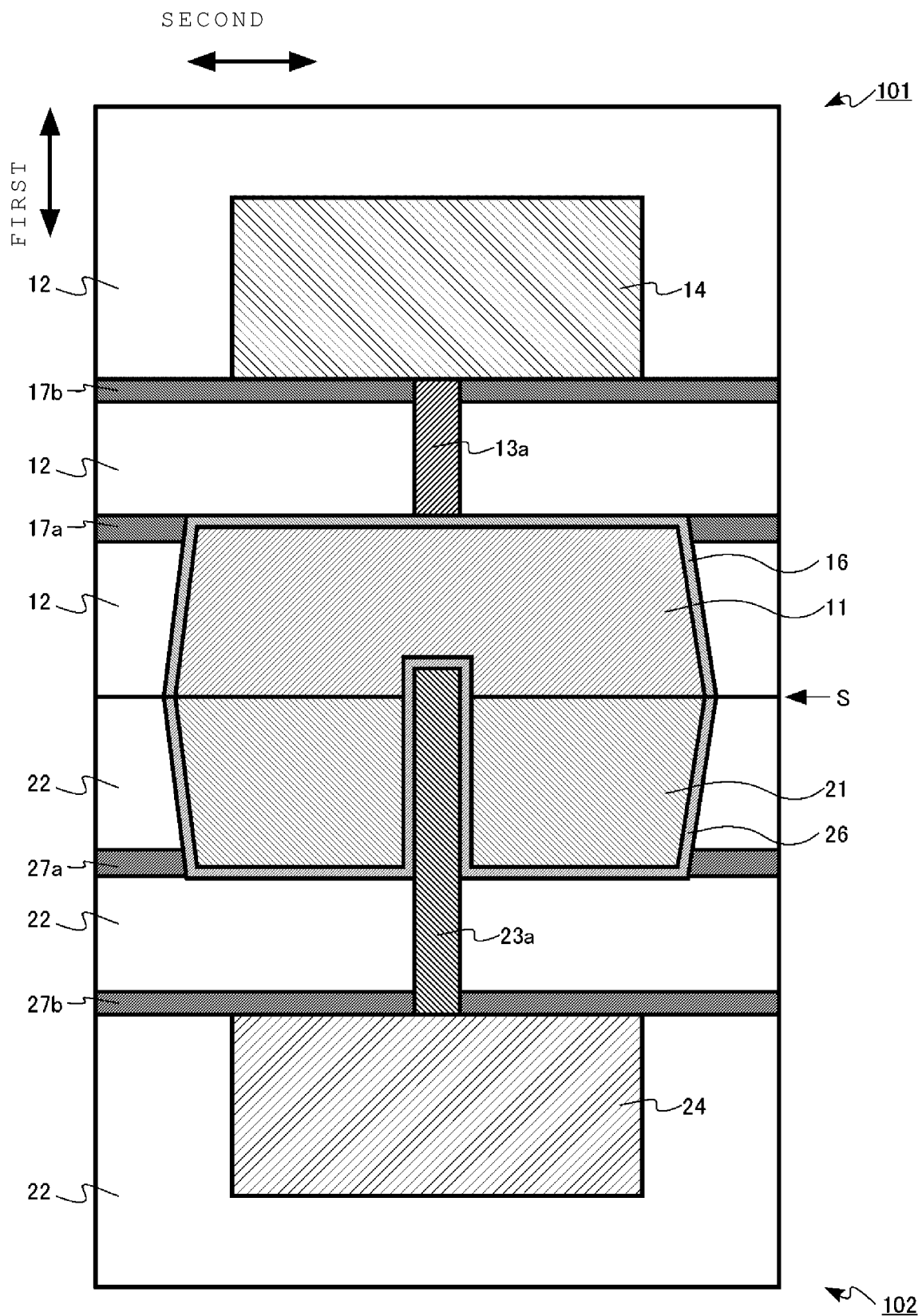
FIG. 18 depicts a connection area in a semiconductor device in a schematic cross-sectional view according to a fourth embodiment.

FIG. 18 shows the connection area in the semiconductor device according to the fourth embodiment in a schematic cross-sectional view.

The memory chip 101-side part of the connection area in the nonvolatile semiconductor memory according to the fourth embodiment includes the first metal pad 11, the first interlayer insulating layer 12, the first contact plug 13a, the first interconnection layer 14, the first barrier metal film 16, the first diffusion preventing film 17a, and the first diffusion preventing film 17b.

The controller chip 102-side part of the connection area in the nonvolatile semiconductor memory according to the fourth embodiment includes the second metal pad 21, the second interlayer insulating layer 22, the second contact plug 23a, the second interconnection layer 24, the second barrier metal film 26, the second diffusion preventing film 27a, and the second diffusion preventing film 27b.

In this context, the first metal pad 11 is an example of a first metal layer. The first interlayer insulating layer 12 is an example of a first insulating layer. The first contact plug 13a is an example of a second conductive body.

The second metal pad 21 is an example of a second metal layer. The second interlayer insulating layer 22 is an example of a second insulating layer. The second contact plug 23a is an example of a first conductive body. The second interconnection layer 24 is an example of a conductive layer. The second barrier metal film 26 is an example of a conductive film.

Part of the second contact plug 23a is provided in the second metal pad 21. Furthermore, in this fourth embodiment the second contact plug 23a extends into the first metal pad 11. An end portion of the second contact plug 23a is provided inside the first metal pad 11. In the present fourth embodiment, at least part of the second contact plug 23a extends through the second metal pad 21 and protrudes into the first metal pad 11 in the first direction.

Part of the second contact plug 23a is surrounded by the second metal pad 21. Another part (an end part) of the second contact plug 23a is surrounded by the first metal pad 11. The end portion of the second contact plug 23a is surrounded by the first metal pad 11. In the present fourth embodiment, the part of the second contact plug 23a that extends through the second metal pad 21 and protrudes into the first metal pad 11 is surrounded by the first metal pad 11.

In this configuration, the distance between the second contact plug 23a and the first metal pad 11 in the first direction is zero because the second contact plug 23a terminates within the first metal pad 11. Therefore, the distance between the second contact plug 23a and the first metal pad 11 in the first direction is less than the thickness of the second metal pad 21 in the first direction.

In the connection area according to the fourth embodiment, providing part of the second contact plug 23a in the first metal pad 11 achieves a further increase in the feed rate of titanium to the voids 80 and the sticking interface S, as compared with the first embodiment.

Therefore, the electromigration resistance of the connection area further improves.

According to the fourth embodiment, it is possible to provide the semiconductor device with further improvement in electromigration resistance and reliability.

While in each of the first to fourth embodiments, the sticking interface S is shown in the drawings, in an end product of the nonvolatile semiconductor memory, it might not always be possible to clearly and visually distinguish the specific position of the sticking interface S after the memory chip 101 has been bonded to the controller chip 102. However, it may be possible in some instanced to determine the position of the sticking interface S is, by observing the misregistration (planar misalignment) between the edge positions of the first metal pad 11 and the second metal pad since typically wafer bonding processes require some planar misalignment margin/tolerance.

While in each of the first to fourth embodiments, the nonvolatile semiconductor memory includes the memory chip 101 as one example of the first substrate and the controller chip 102 as one example of the second substrate, the semiconductor device according to the disclosure is not limited to such a case. The disclosure is applicable to, for example, an optical sensor including a pixel chip as the first substrate and a controller chip as the second substrate.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a first chip including a first insulating layer;
   a second chip bonded to the first chip and including a second insulating layer contacting the first insulating layer at a sticking interface of the first and second chips;
   a metal layer at the sticking interface and including a first portion surrounded by the first insulating layer and a second portion surrounded by the second insulating layer;
   a first conductive body extending in a first direction from the second chip toward the first chip, the first conductive body including a portion extending into the second portion of the metal layer; and a conductive film including a first element, the conductive film being between the first conductive body and the second portion of the metal layer and also between the second insulating layer and the second portion of the metal layer, wherein the first element is segregated to the sticking interface in the metal layer.

2. The semiconductor device according to claim 1, wherein the distance between the first conductive body and the first portion of the metal layer in the first direction is equal to or less than one half of the maximum thickness of the second portion of the metal layer in the first direction.

3. The semiconductor device according to claim 1, wherein the distance between the first conductive body and the first portion of the metal layer in the first direction is shorter than the distance from the sticking interface to the first conductive body in a second direction perpendicular to the first direction.

4. The semiconductor device according to claim 1, wherein the metal layer comprises copper.

5. The semiconductor device according to claim 1, wherein the first conductive body comprises tungsten.

6. The semiconductor device according to claim 1 wherein the conductive film includes at least one metallic element selected from among a group consisting of titanium, tantalum, manganese, and cobalt.

7. The semiconductor device according to claim 1, wherein the first conductive body is separated from the first portion of the metal layer in the first direction.

8. The semiconductor device according to claim 1, wherein the first conductive body extends into the first portion of the metal layer.

9. The semiconductor device according to claim 1, further comprising:
a second conductive body that is in the first portion of the metal layer and extends in the first direction towards the second portion of the metal layer.

10. The semiconductor device according to claim 1, further comprising:
a second conductive body that is in the second portion of the metal layer and extends in the first direction towards the first portion of the metal layer, wherein
the second conductive body is spaced from the first conductive body in a second direction perpendicular to the first direction.

11. The semiconductor device according to claim 1, wherein
the first chip includes a memory cell array, and
the second chip includes a control circuit configured to control the memory cell array.

12. The semiconductor device according to claim 11, wherein
the metal layer is electrically connected to the memory cell array and
the control circuit.

13. The semiconductor device according to claim 1, wherein the first element is titanium.

14. A semiconductor device, comprising:
a first substrate having a first side and including:
a first metal layer on the first side; and
a first insulating layer surrounding the first metal layer in a plane parallel to the first side; and
a second substrate having a second side bonded to the first side of the first substrate, the second substrate including:
a second metal layer on the second side and in contact with the first metal layer;
a second insulating layer surrounding the second metal layer in a plane parallel to the second side and in contact with the first insulating layer; and
a first conductive body in the second insulating layer and extending in a first direction into the second metal layer from the second insulating layer towards the first metal layer, wherein
the second substrate further includes a second conductive body in the second insulating layer and extending in the first direction into the second metal layer from the second insulating layer towards the first metal layer, the first and second conductive bodies being spaced from each other in a second direction perpendicular to the first direction.

15. The semiconductor device according to claim 14, wherein the first conductive body extends in the first direction through the second metal layer into the first metal layer.

16. The semiconductor device according to claim 14, wherein the first substrate further includes a third conductive body in the first insulating layer that extends into the first metal layer from the first insulating layer towards the second metal layer.

17. A semiconductor device, comprising:
a first substrate with a first side, the first substrate including:
a first metal layer on the first side, and
a first insulating layer on the first side that surrounds the first metal layer; and
a second substrate with a second side, the second substrate including:
a second metal layer on the second side and contacting the first metal layer,
a second insulating layer on the second side that surrounds the second metal layer and contacts the first insulating layer, and
a first conductive body in the second substrate below the second metal layer and including a part that extends into the second metal layer towards the first metal layer in a first direction, wherein
the distance between the first conductive body and the first metal layer in the first direction is equal to or less than one half of the maximum thickness of the second metal layer in the first direction.

18. The semiconductor device according to claim 17, wherein the second substrate further comprises a conductive film that is between the first conductive body and the second metal layer and also between the first conductive body and the second insulating layer.

19. The semiconductor device according to claim 18, wherein the conductive film includes at least one metallic element selected from among a group consisting of titanium, tantalum, manganese, and cobalt.

20. The semiconductor device according to claim 17, wherein
the second substrate further includes a conductive layer,
the first conductive body is between the conductive layer and the second metal layer, and
the conductive layer is electrically connected to the first conductive body.

* * * * *